United States Patent [19]
Gardiner et al.

[11] Patent Number: 5,337,651
[45] Date of Patent: Aug. 16, 1994

[54] APPARATUS AND METHOD FOR PROTECTION OF PUMPS USED FOR DELIVERY OF AIR- OR MOISTURE-SENSITIVE LIQUIDS

[75] Inventors: Robin A. Gardiner; Peter S. Kirlin, both of Bethel, Conn.

[73] Assignee: Advanced Technology Materials, Inc., Danbury, Conn.

[21] Appl. No.: 32,984

[22] Filed: Mar. 18, 1993

Related U.S. Application Data

[63] Continuation-in-part of Ser. No. 807,807, Dec. 13, 1991, Pat. No. 5,204,314, which is a continuation of Ser. No. 549,389, Jul. 6, 1990, abandoned.

[51] Int. Cl.$^5$ ............................................. F01B 31/00
[52] U.S. Cl. ................................. 92/87; 417/431
[58] Field of Search ............... 92/87, 11 L; 417/431

[56] References Cited

U.S. PATENT DOCUMENTS

| | | | |
|---|---|---|---|
| 1,483,143 | 2/1924 | Whitlock | 92/87 X |
| 3,516,760 | 6/1970 | Dettinger | 417/53 |
| 4,833,976 | 5/1989 | Loland | 92/87 X |
| 5,204,314 | 3/1993 | Kirlin et al. | 505/1 |

FOREIGN PATENT DOCUMENTS

| | | | |
|---|---|---|---|
| 2710428 | 9/1978 | Fed. Rep. of Germany | 92/87 |
| 1097534 | 7/1955 | France | 92/87 |

OTHER PUBLICATIONS

Novellus Concept One System Manual, Revision 2, Jul. 5, 1989, Section 4, vol. 1, pp. 4-43, 4-44, and 4-100, Novellus Corporation, San Jose, California.

*Primary Examiner*—Richard E. Gluck
*Attorney, Agent, or Firm*—Janet R. Elliott; Steven J. Hultquist

[57] ABSTRACT

A means and method for protecting the moving parts of a pump that is used to pump air- or moisture-sensitive liquids, comprising blanketing the wetted parts of the pump with an inert medium and/or admixing the process liquid with a low vapor pressure liquid component effective for inhibiting corrosion or particulate formation. In another aspect, the invention relates to an apparatus for protecting the wetted, moving parts of pumps used to pump air- or moisture-sensitive liquids. The apparatus provides a mantle within which an inert medium is flowed around the moving, wetted pump parts to continually purge them of any air or moisture.

6 Claims, 2 Drawing Sheets

APPARATUS AND METHOD FOR PROTECTION OF PUMPS USED FOR DELIVERY OF AIR- OR MOISTURE-SENSITIVE LIQUIDS

CROSS-REFERENCE TO RELATED APPLICATIONS

This is a continuation-in-part of prior co-pending U.S. application Ser. No. 07/807,807 filed Dec. 13, 1991, now U.S. Pat. No. 5,204,314, in the names of Peter S. Kirlin, Robin L. Binder, and Robin A. Gardiner, which is a continuation of U.S. application Ser. No. 07/549,389, filed Jul. 6, 1990 in the same names, abandoned.

BACKGROUND OF THE INVENTION

1. Field of the Invention

This invention relates to a means and method for protecting the wetted parts of pumps that are used to meter air- or moisture-sensitive liquids. The means and method of the invention protect such pumps from corrosion and degradation that can result when the liquids being pumped react with air or moisture to form solid particles.

2. Description of the Related Art

Recently many refractory materials have been identified as having unique materials properties. The recently discovered high temperature superconducting (HTSC) materials include $YBa_2Cu_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are materials that are useful for scintillation detecting and coating of optical fibers. Refractory oxides such as $Ta_2O_5$ are seeing expanded use in the microelectronics industry; $Ta_2O_5$ is envisioned as a thin-film capacitor material whose use may enable higher density memory devices to be fabricated.

Many of the potential application of these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Chemical vapor deposition (CVD) is a particularly attractive method for forming these layers because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents must be sufficiently volatile to permit gas phase transport into the deposition reactor. The element source reagent must decompose in the reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In addition, the reagents must not be so chemically stable that they do not react in the deposition chamber.

Thus a desirable CVD reagent is fairly reactive and volatile. Unfortunately, for many of the refractive materials described above, volatile reagents do not exist. Many potentially highly useful refractory materials have in common that one or more of their components are elements, such as the Group II metals barium, calcium, or strontium, or early transition metals zirconium or hafnium, for which no volatile compounds well-suited for CVD are known. In many cases, the source reagents are solids whose sublimation temperature may be very close to the decomposition temperature, in which case the reagent may begin to decompose in the lines before reaching the reactor, and it will be very difficult to control the stoichiometry of the deposited films.

In other cases, the CVD reagents are liquids, but their delivery into the CVD reactor in the vapor phase has proven problematic because of problems of premature decomposition or stoichiometry control.

The problem of controlled delivery of CVD reagents into deposition reactors was addressed by the inventors in U.S. patent application Ser. No. 5,204,807, which is a continuation of U.S. patent application Ser. No. 07/549,389, now abandoned "Method for Delivering an Involatile Reagent in Vapor Form to a CVD Reactor," and further elaborated in U.S. patent application Ser. No. 07/927,134, "Apparatus and Method for Delivery of Involatile Reagents," which hereby are incorporated herein by reference. As described and claimed in these patents, the delivery of reagents into the deposition chamber in vapor form is accomplished by providing the reagent in a liquid form, neat or solution, and flowing the reagent liquid onto a flash vaporization matrix structure which is heated to a temperature sufficient to flash vaporize the reagent source liquid. A carrier gas may optionally be flowed by the flash vaporization matrix structure to form a carrier gas mixture containing the flash vaporized reagent source liquid.

The means for flowing the reagent liquid onto the flash vaporization matrix may be any suitable liquid pumping means, such as a positive displacement liquid pump. In practice, the method chosen for pumping the liquid is often a piston pump.

Serious problems of pump particle generation and hence plugging of orifices and degradation of seals are encountered when air- or moisture-sensitive liquids are metered by piston pumps that have moving, wetted parts. For example, when the metering piston's wetted surfaces are exposed to air, reactions between the liquid being pumped and air or moisture can occur that produce oxidic particles. These particles erode the piston seals, leading to pump breakdown.

A related problem is the degradation of pump seals that can result when the reagent being pumped is a solid dissolved in a relatively volatile liquid solvent. The solvent evaporates, leaving behind the solid which abrades the seal.

Many reactive liquids that are used as source reagents in processes for film or layer deposition have caused problems in pumping. Some of these compounds are readily hydrolyzed by moisture in the air, such as tantalum ethoxide, tetraethyl orthosilicate (TEOS), other metal alkoxide compounds such as zirconium tetra-tert-butoxide, and metal amide reagents such as tetrakis(-dialkylamido)titanium compounds. These moisture-sensitive compounds react to form oxide particles that are especially hard on the piston seals. Other compounds used in deposition processes are highly air-sensitive. Examples include the aluminum source reagents such as tri-isobutylaluminum and trimethylamine alane (a solid which may be used in solution in a solvent which is chemically inert to the aluminum reagent, such as hexane), other Group III reagents such as trimethylgallium, and some Group V reagents such as trialkylantimony compounds. Such compounds react with oxygen, likewise to form destructive oxide particles.

For example, when a dual piston metering pump was used to deliver tantalum pentaethoxide, a moisture-sensitive liquid, tantalum oxide built up on the pistons after tens of hours which eroded the piston seals and eventually stopped any piston movement.

This problem with pumping reactive liquids has hindered the usage of liquid delivery systems of all sorts, including but not limited to the type described and claimed in U.S. patent applications Ser. Nos. 07/807,807 and 07/927,134. In reactive liquids pumping systems that do not employ the inert purge blanket system of the present invention, maintenance becomes a problem. Such pumping systems have a shorter mean time to failure and frequent downtime for maintenance steps such as seal replacement.

Similar pumping problems have been encountered in other systems. In most cases, the solution proposed to address attack on piston seals and other wetted parts has been to coat the parts with a chemically resistant coating, for example Teflon ® coatings or coatings of other inert polymeric material(s). This approach, however, does not address the problems created by oxide particle formation as described above. While the pump parts may thereby be protected from chemical attack, the particles still have the potential to physically abrade moving parts, clog orifices, and score the chemically resistant coating(s).

U.S. Pat. No. 3,516,760 describes a method to protect a piston pump conveying a corrosive reaction mixture, at least one constituent of which is a liquid which does not corrode the material in the stuffing box. A suitable amount of the noncorrosive liquid is injected into an annular gap surrounding the piston, under pressure sufficient to prevent the corrosive mixture from reaching the stuffing box. In the manufacture of urea, the packing material is protected from corrosive attack by the carbamate intermediate by injecting liquid ammonia into the annular gap. As ammonia enters the carbamate mixture, this procedure provides a means for returning ammonia which has been lost from the mixture, thus increasing the yield of carbamate as well as preserving the packing in the stuffing box. The ammonia acts as a scavenger, since it is one of the reactants in the process. This approach is not broadly applicable, since not all air- or moisture-sensitive liquids being pumped contain a noncorrosive component, and indeed not all liquids being pumped are mixtures.

Accordingly, it is an object of the present invention to provide a means and method for protecting the moving parts of pumps used to deliver air- and moisture-sensitive liquids by which these previous obstacles are overcome.

Other objects and advantages of the present invention will be more fully apparent from the ensuing disclosure and appended claims.

SUMMARY OF THE INVENTION

In one aspect, the present invention relates to a method for protecting the moving parts of a pump that is used to pump air- or moisture-sensitive liquids, comprising blanketing the wetted parts of the pump with an inert medium. In another aspect, the invention relates to an apparatus for protecting the wetted, moving parts of pumps used to pump air- or moisture-sensitive liquids. The apparatus provides a mantle within which an inert medium is flowed around the moving, wetted pump parts to continually purge them of any air or moisture.

Other aspects and features of the invention will be more fully apparent from the ensuing disclosure and appended claims.

DETAILED DESCRIPTION OF THE INVENTION, AND PREFERRED EMBODIMENTS THEREOF

Figure 1A:
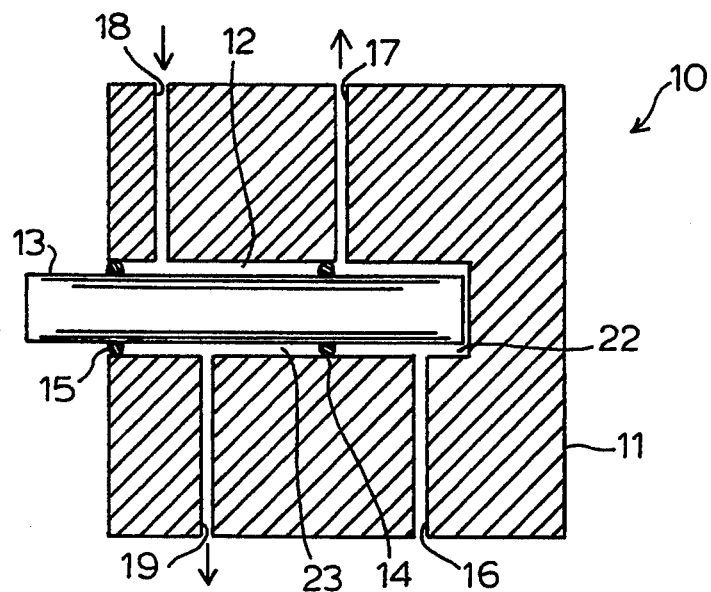
FIG. 1A is a schematic representation of a dual piston metering pump incorporating an inert blanket purge, showing the piston in the fully inserted position.

The present invention is based on the observation that if the wetted, moving parts of a pump used to pump air- or moisture-sensitive liquids were protected from exposure to air or moisture, the service life of the pump could be dramatically extended. Oxide particle build-up could be avoided or minimized, with a concomitant improvement in pump performance and increase in the interval between service shut-downs which are required to prevent catastrophic seal failure.

The inert medium is purged through a chamber surrounding the pump's moving, wetted parts. The inert medium may be flowed through the chamber continually or intermittently, with the proviso that the atmosphere surrounding the moving, wetted pump parts must be kept substantially free of reactive species such as oxygen or moisture.

The inert medium is a fluid selected with the criterion that it must not react with the chemical being pumped. The inert fluid may be a gas or liquid. A dry, inert gas such as argon, nitrogen or helium is a preferred inert medium, although there are cases where ultra-dry air may be adequate. Other dry inert gases such as neon, krypton, or hydrogen could also be used. Alternatively, the liquid being pumped could be used as the inert fluid medium to purge the pumps wetted parts, in a recirculating system that would be hermetically sealed.

Degradation of pump seals can result when the reagent being pumped is a solid dissolved in a relatively volatile liquid solvent. The solvent evaporates, leaving behind the solid which abrades the seal. In such cases, the addition of a low vapor pressure liquid to the reagent solution alleviates the problem by preventing the solution from drying out on the pump seals. As used herein, a low vapor pressure liquid refers to liquids having boiling points above about 150° C. In addition, the low vapor pressure liquid added to the reagent solution should (1) have a low vapor pressure, (2) be at least moderately soluble in the relatively volatile liquid solvent, and (3) should be a liquid in which the solid reagent is soluble.

Solid reagents such as those described in U.S. patent application Ser. No. 07/807,807, "Method for Delivering an Involatile Reagent in Vapor Form to a CVD Reactor," the disclosure of which hereby is incorporated herein by reference, are customarily dissolved in a low-boiling alcohol or ether solvent such as isopropanol or tetrahydrofuran or isopropanol/tetrahydrofuran mixtures. The added low volatility liquid can advantageously be a polyether such as tetraglyme (tetraethylene glycol dimethyl ether, boiling point ~275° C.) or triglyme (triethylene glycol dimethyl ether, boiling point ~216° C.). Polyamines such as tetraethylenepentamine (boiling point 340° ) or triethylenetetramine (boiling point 266°–267° C.) could also be selected. These low volatility liquids are soluble in the alcohol or ether solvent and also dissolve the solid reagents. For example, when the solvent is isopropanol or an isopropanol/tetrahydrofuran mixture and the solid reagent is a metal beta-diketonate complex, tetraglyme has been shown to be effective as the low volatility liquid. A typical solution is exemplified by 0.1M barium(thd)$_2$- (bis(2,2,6,6-tetramethyl-3,5-heptanedionato)barium) dissolved in 9:1 isopropanol:tetraglyme.

The chamber surrounding the pump's wetted parts may be of any suitable size and shape, with the key proviso that a gas or liquid may be flowed through the chamber so as to completely blanket all moving, wetted parts of the pump.

Figure 1B:
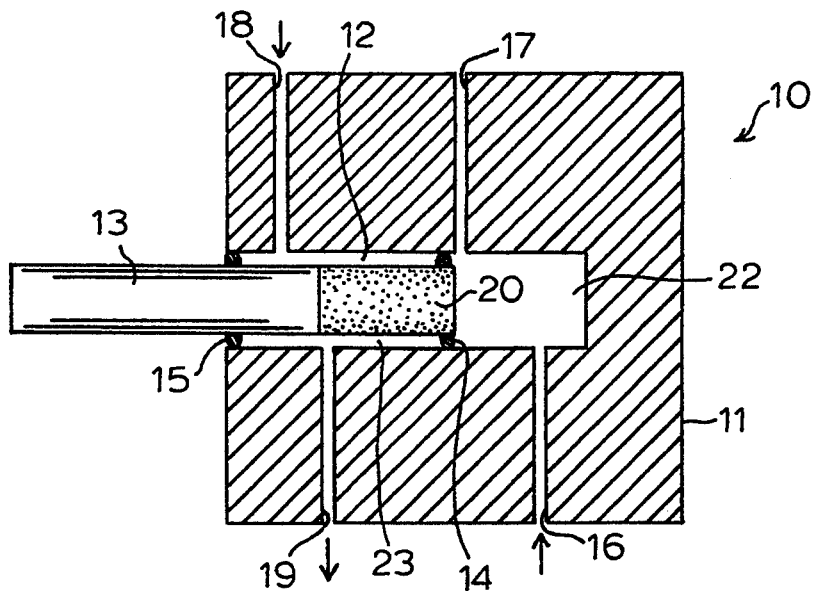
FIG. 1B is a schematic representation of a dual piston metering pump incorporating an inert blanket purge, showing the piston in the fully withdrawn position.

FIG. 1A is a schematic representation of a dual piston metering pump 10 incorporating an inert blanket purge, showing the piston in the fully inserted position, with FIG. 1B showing the pump 10 with the piston in the fully withdrawn position. Pump block 11 has an interior pumping cavity 12 and a piston 13 positioned in the pumping cavity for reciprocatable movement therein. A first liquid seal 14 is mounted in the pumping cavity and circumscribingly arranged about the piston so as (i) to effect sealing between the piston and the pumping cavity during reciprocating movement of the piston in the cavity and (ii) to bound an inner liquid pumping volume 22 of the pumping cavity. A second gas seal 15 is mounted in the pumping cavity and circumscribingly arranged about the piston to effect sealing between the piston and the pumping cavity during reciprocating movement of the piston in the cavity, this second gas seal being in spaced-apart relationship to the first liquid seal 14 so as to define an intraseal volume 23 of the pumping cavity therebetween. An inlet liquid passage 16 is joined to the inner liquid pumping volume 22 for introduction of feed liquid thereto, and an outlet liquid passage 17 is joined to the inner liquid pumping volume for discharging of pressurized liquid therefrom. A gas inlet passage 18 is joined to the intraseal volume 23 of the pumping cavity for introduction of a purge gas thereto, and a gas outlet passage 19 joined to the intraseal volume of the pumping cavity for discharging of the purge gas therefrom. Thus a portion of the piston during reciprocating movement thereof is translated between the liquid pumping volume 22 of the pumping cavity and the intraseal volume 23 of the pumping cavity.

A flow of inert gas is maintained at a suitable flow rate, e.g., 0.2–5 standard liters per minute (slpm) during the operation of the pump. When the piston 13 is in the fully inserted position (FIG. 1A), pressurized liquid is discharged from pump block 11 via outlet liquid passage 17. When the piston 13 is in the withdrawn position (FIG. 1B), liquid flows to the pumping cavity via inlet liquid passage 16. The piston's wetted surface 20 remains in the purged space (intraseal volume 23), and therefore is protected from contact with reactive species such as water or oxygen in the surrounding ambient atmosphere.

Figure 2:
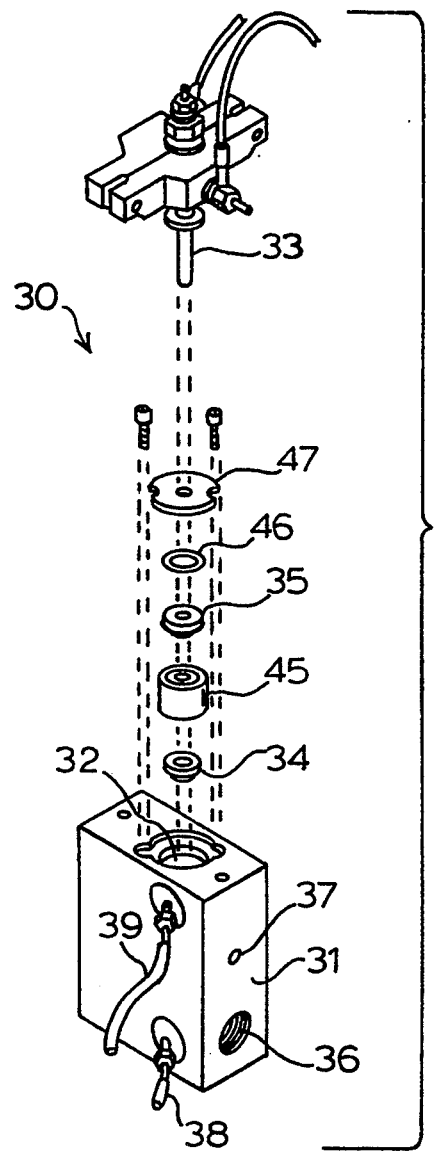
FIG. 2 shows an exploded schematic view of a dual piston metering pump incorporating an inert blanket purge.

FIG. 2 shows an exploded schematic view of a dual piston metering pump 30 incorporating an inert blanket purge. Pump block 31 has an interior pumping cavity 32 and a piston 33 which during use is positioned in the pumping cavity for reciprocatable movement therein. A first liquid seal 34 is mounted in the pumping cavity with piston seal holder 45 so as to effect sealing between the piston and the pumping cavity during reciprocating movement of the piston in the cavity, and to bound an inner liquid pumping volume of the pumping cavity. A second gas seal 35 is mounted in the pumping cavity to effect sealing between the piston and the pumping cavity during reciprocating movement of the piston in the cavity, this second gas seal being in spaced-apart relationship to the first liquid seal 34 so as to define an intraseal volume of the pumping cavity therebetween. An inlet liquid passage 36 is joined to the inner liquid pumping volume for introduction of feed liquid thereto, and an outlet liquid passage 37 is joined to the inner liquid pumping volume for discharging of pressurized liquid therefrom. A gas inlet passage 38 is joined to the intraseal volume of the pumping cavity for introduction of a purge gas thereto, and a gas outlet passage 39 is joined to the intraseal volume of the pumping cavity for discharging of the purge gas therefrom. These are held in place by O-ring 46 and piston seal cover 47. Thus a portion of the piston during reciprocating movement thereof is translated between the liquid pumping volume of the pumping cavity and the intraseal volume of the pumping cavity.

EXAMPLE 1

Use of a dual piston metering pump as depicted schematically in the Figures to deliver the reagent tantalum pentaethoxide, a moisture-sensitive liquid, caused a build-up of tantalum oxide on the pistons after tens of hours, which eroded the piston seals and stopped any piston movement. When dry nitrogen was purged around the wetted parts of the pump, no visible build-up of tantalum oxide was observed after tens of hours of use, and pump operation continued smoothly.

EXAMPLE 2

The dual piston metering pump equipped with the purge mechanism was used for delivery of 54 ml (50.2 g) of tetrakis(dimethylamido)titanium reagent. This titanium reagent is extremely air- and moisture-sensitive, decomposing in air to dimethylamine and solid titanium oxides and/or hydroxides over the space of a few minutes. The purged dual piston pump was loaded with tetrakis(dimethylamido)titanium for seven weeks and used to deliver the reagent for greater than 20 hours with no detectable deterioration in the pump seals and no visible build-up of solid decomposition products on the wetted parts.

It will be recognized that the identity of the inert (purge blanket) medium and the materials of construction of the chamber and pump parts may be varied widely, in accordance with the disclosure of the invention described herein.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A pump subassembly useful for pumping of liquids latently susceptible to formation of particulates abradingly detrimental to pump active surfaces, and/or capable of inducing corrosion of such surfaces, said pump subassembly comprising:
    a unitary pump block of rectangular parallelpiped shape with exterior flat faces and with an elongate constant diameter cylindrical interior pumping cavity therein having a central longitudinal axis;
    an elongate cylindrical piston positioned in the pumping cavity for reciprocatable movement therein;
    seal means for the piston, consisting essentially of:
        a first seal for liquid sealing, mounted in the pumping cavity and circumscribingly arranged about the piston (i) to effect sealing between the piston and the pumping cavity during reciprocating movement of the piston in the cavity, and (ii) to bound an inner liquid pumping volume of the pumping cavity; and
        a second seal for fluid sealing, mounted in the pumping cavity and circumscribingly arranged about the piston to effect sealing between the piston and the pumping cavity during reciprocating movement of the piston in the cavity, the second seal for fluid sealing being in longitudinally spaced-apart relationship to the first seal for liquid sealing to define an intraseal volume of the pumping cavity therebetween;
    an inlet liquid passage extending linearly from a face of the unitary pump block to the inner liquid pumping volume for introduction of feed liquid thereto;
    an outlet liquid passage extending linearly from a face of the unitary pump block to the inner liquid pumping volume for discharging of pressurized liquid therefrom;
    a fluid inlet passage extending linearly from a face of the unitary pump block to the intraseal volume of the pumping cavity for introduction of a purge gas or liquid thereto; and
    a fluid outlet passage extending linearly from a face of the unitary pump block to the intraseal volume of the pumping cavity for discharging of purge gas or liquid therefrom;
    wherein each of said passages extends linearly through the unitary pump block perpendicular to the central longitudinal axis of the cylindrical interior pumping cavity of the unitary pump block; and
    means for reciprocating the elongate cylindrical piston in the pumping cavity so that a portion of the piston during reciprocating movement thereof is translated between the liquid pumping volume of the pumping cavity and the intraseal volume of the pumping cavity.

2. A pump as in claim 1, additionally comprising feed liquid supply means joined in liquid supply relationship to the liquid inlet passage.

3. A pump as in claim 1, additionally comprising purge fluid supply means joined in fluid supply relationship to the fluid inlet passage.

4. A pump as in claim 1, wherein the pump block comprises a unitary machined metal block.

5. A process for inhibiting corrosion and/or particulate formation in a reciprocating piston pump adapted for pumping of liquid mediating said corrosion and/or particulate formation in the presence of oxygen and/or other atmospheric gases, wherein the reciprocating position is reciprocatable between a first extended position in a liquid pumping chamber of the pump and a second retracted position exterior of the pumping chamber, that an active pumping portion of the reciprocating piston sequentially and repetitively contacts liquid in the liquid pumping chamber and then is withdrawn exteriorly of the liquid pumping chamber, said process comprising:
    providing a pump subassembly comprising:
        a unitary pump block of rectangular parallelpiped shape with exterior flat faces and with an elongate constant diameter cylindrical interior pumping cavity therein having a central longitudinal axis;
        an elongate cylindrical piston positioned in the pumping cavity for reciprocatable movement therein;
        seal means for the piston, consisting essentially of:
            a first seal for liquid sealing, mounted in the pumping cavity and circumscribingly arranged about the piston (i) to effect sealing between the piston and the pumping cavity during reciprocating movement of the piston in the cavity, and (ii) to bound an inner liquid pumping volume of the pumping cavity; and
            a second seal for fluid sealing, mounted in the pumping cavity and circumscribingly arranged about the piston to effect sealing between the piston and the pumping cavity during reciprocating movement of the piston in the cavity, the second seal for fluid sealing being in longitudinally spaced-apart relationship to the first seal for liquid sealing to define an intraseal volume of the pumping cavity therebetween;
        an inlet liquid passage extending linearly from a face of the unitary pump block to the inner liquid pumping volume for introduction of feed liquid thereto;
        an outlet liquid passage extending linearly from a face of the unitary pump block to the inner liquid pumping volume for discharging of pressurized liquid therefrom;
        a fluid inlet passage extending linearly from a face of the unitary pump block to the intraseal volume of the pumping cavity for introduction of a purge gas or liquid thereto; and
        a fluid outlet passage extending linearly from a face of the unitary pump block to the intraseal volume of the pumping cavity for discharging of purge gas or liquid therefrom;
        wherein each of said passages extends linearly through the unitary pump block perpendicular to the central longitudinal axis of the cylindrical interior pumping cavity of the unitary pump block; and means for reciprocating the elongate cylindrical piston in the pumping cavity so that a portion of the piston during reciprocating movement thereof is translated between the liquid pumping volume of the pumping cavity and the intraseal volume of the pumping cavity; and reciprocating the position in the pumping cavity;

flowing feed liquid through the inlet liquid passage to the pumping cavity;

discharging pressurized liquid from the pumping cavity through the outlet liquid passage;

flowing purge fluid through the fluid inlet passage into the intraseal volume of the pumping cavity; and discharging purge fluid from the intraseal volume of the pumping cavity through the fluid outlet passage.

6. A process according to claim 5, wherein purge fluid is flowed through the fluid inlet passage into the intraseal volume of the pumping cavity at a flow rate of from 0.2 to 5 standard liters per minute.

* * * * *